United States Patent
Ishii et al.

(10) Patent No.: US 8,178,949 B2
(45) Date of Patent: May 15, 2012

(54) BIPOLAR SEMICONDUCTOR DEVICE, METHOD FOR PRODUCING THE SAME, AND METHOD FOR CONTROLLING ZENER VOLTAGE

(75) Inventors: Ryosuke Ishii, Amagasaki (JP); Koji Nakayama, Amagasaki (JP); Yoshitaka Sugawara, Amagasaki (JP); Hidekazu Tsuchida, Yokosuka (JP)

(73) Assignees: The Kansai Electric Power Co., Inc., Osaka (JP); Central Research Institute of Electric Power Industry, Tokyo (JP)

( * ) Notice: Subject to any disclaimer, the term of this patent is extended or adjusted under 35 U.S.C. 154(b) by 154 days.

(21) Appl. No.: 12/525,198

(22) PCT Filed: Jan. 31, 2008

(86) PCT No.: PCT/JP2008/051544
§ 371 (c)(1),
(2), (4) Date: Jul. 30, 2009

(87) PCT Pub. No.: WO2008/093789
PCT Pub. Date: Aug. 7, 2008

(65) Prior Publication Data
US 2010/0032686 A1 Feb. 11, 2010

(30) Foreign Application Priority Data

Jan. 31, 2007 (JP) .................. 2007-021638
Nov. 27, 2007 (JP) .................. 2007-306297

(51) Int. Cl.
*H01L 21/331* (2006.01)

(52) U.S. Cl. .......... 257/586; 257/E21.372; 438/343
(58) Field of Classification Search .......... 257/586, 257/E21.372; 438/343
See application file for complete search history.

(56) References Cited

U.S. PATENT DOCUMENTS

| | | | |
|---|---|---|---|
| 6,083,814 A | 7/2000 | Nilsson | |
| 6,353,236 B1* | 3/2002 | Yatsuo et al. | 257/77 |
| 6,639,301 B2 | 10/2003 | Andoh | |
| 6,784,520 B2 | 8/2004 | Doi | |
| 7,521,774 B2* | 4/2009 | Spitz et al. | 257/606 |
| 2007/0170436 A1* | 7/2007 | Sugawara | 257/77 |

FOREIGN PATENT DOCUMENTS

JP 2001085704 A 3/2001
(Continued)

OTHER PUBLICATIONS

Godignon, P. et al., "Highly-Doped Implanted pn Junction for SiC Zener Diode Fabrication", Materials Science Forum, 2002, pp. 1317-1320, vols. 389-393, Trans Tech Publications, Switzerland.

(Continued)

*Primary Examiner* — Steven J Fulk
(74) *Attorney, Agent, or Firm* — The Webb Law Firm

(57) ABSTRACT

Bipolar semiconductor devices have a Zener voltage controlled very precisely in a wide range of Zener voltages (for example, from 10 to 500 V). A bipolar semiconductor device has a mesa structure and includes a silicon carbide single crystal substrate of a first conductivity type, a silicon carbide conductive layer of a first conductivity type, a highly doped layer of a second conductivity type and a silicon carbide conductive layer of a second conductivity type which substrate and conductive layers are laminated in the order named.

10 Claims, 6 Drawing Sheets

FOREIGN PATENT DOCUMENTS

| | | | |
|---|---|---|---|
| JP | 2002184782 A | 6/2002 | |
| JP | 2002185015 A | 6/2002 | |
| JP | 2004006676 A | 1/2004 | |
| WO | 0249114 A2 | 6/2002 | |
| WO | 2005076369 A1 | 8/2005 | |
| WO | WO 2005076369 A1 | * | 8/2005 |

OTHER PUBLICATIONS

Vassilevski, K.V. et al., "Low Voltage Silicon Carbide Zener Diode", Materials Science Forum, 2004, pp. 1029-1032, vols. 457-460, Trans Tech Publications, Switzerland.

Negoro, Y. et al., "Electrical activation of high-concentration aluminum implanted in 4H-SiC", Journal of Applied Physics, Nov. 1, 2004, pp. 4916-4922, vol. 96, No. 9, American Institute of Physics.

Kuhr, Thomas A. et al., "Spontaneous formation of stacking faults in highly doped 4H-SiC during annealing", Journal of Applied Physics, Nov. 15, 2002, pp. 5863-5871, vol. 92, No. 10, American Institute of Physics.

Laube, M. et al., "Electrical activation of high-concentration aluminum implanted in 4H-SiC", Journal of Applied Physics, Jul. 1, 2002, pp. 549-554, vol. 92, No. 1, American Institute of Physics.

Rao, Mulpuri V. et al., "Ion-Implantation in bulk semi-insulating 4H-SiC", Journal of Applied Physics, Jul. 15, 1999, pp. 752-758, vol. 86, No. 2, American Institute of Physics.

SiC Kei Seramikku Shinzairyou (SiC ceramic new materials), Japan Society for the Promotion of Science, 124th Committee, Uchida Rokakuho Publication Co., Ltd., p. 342, Feb. 28, 2001.

* cited by examiner

BIPOLAR SEMICONDUCTOR DEVICE, METHOD FOR PRODUCING THE SAME, AND METHOD FOR CONTROLLING ZENER VOLTAGE

FIELD OF THE INVENTION

The present invention relates to bipolar semiconductor devices, methods for producing the same, and methods for controlling the Zener voltage. In more detail, the invention relates to Zener diodes, in particular to Zener diodes using silicon carbide.

BACKGROUND OF THE INVENTION

Zener diodes are bipolar semiconductor devices that have a p-n junction interface with high carrier densities. They utilize breakdown (avalanche breakdown or Zener breakdown) caused when a reverse voltage is applied. When the breakdown voltage is caused, the diodes keep the voltage between terminals constant irrespective of the current (hereinafter, the Zener voltage).

Zener diodes using Si or the like are known in the art. The present inventors then studied methods for manufacturing Zener diodes using silicon carbide (SiC). Compared to silicon (Si), SiC has superior properties such as approximately ten fold dielectric breakdown strength and approximately three fold thermal conductivity, and attracts attention as a material suited for power semiconductor devices.

Known SiC bipolar semiconductor devices include p-n diodes (Patent Document 1, Non-Patent Documents 1 to 7). For example, compared to Si p-n diodes that withstand 10 kV, SiC p-n diodes withstanding such a high voltage have a low forward voltage, being approximately ⅓, and an high speed-reverse recovery time corresponding to the speed during the OFF operation, being approximately 1/20 or less, and can reduce electric loss to approximately ⅕ or less, thereby greatly contributing to energy saving.

SiC bipolar devices other than SiC p-n diodes, for example SiC n-p-n transistors, SiC SIAFET and SiC SIJFET are also reported to reduce electric loss.

Patent Document 1: JP-A-2002-185015
Non-Patent Document 1: Material Science Forum Vols. 389-393 (2002), pp. 1317-1320
Non-Patent Document 2: Material Science Forum Vols. 457-460 (2004), pp. 1029-1032
Non-Patent Document 3: SiC Kei Seramikku Shinzairyou (SiC ceramic new materials) (Japan Society for the Promotion of Science, 124$^{th}$ Committee, UCHIDA ROKAKUHO PUBLISHING CO., LTD., P. 342)
Non-Patent Document 4: Journal of Applied Physics, Vol. 96, No. 9 (2004), pp. 4916-4922
Non-Patent Document 5: Journal of Applied Physics, Vol. 92, No. 10 (2002), pp. 5863-587
Non-Patent Document 6: Journal of Applied Physics, Vol. 92, No. 1 (2002), pp. 549-554
Non-Patent Document 7: Journal of Applied Physics, Vol. 86, No. 2 (1999), pp. 752-758

In the manufacturing of SiC Zener diodes, a p-n junction is formed by epitaxial growth of an SIC conductive layer of a first conductivity type on an SiC substrate of a first conductivity type, and then epitaxial growth of an SiC conductive layer of a second conductivity type on the surface of the SIC conductive layer of a first conductivity type or ion-implantation of a second conductivity type into the surface of the SiC conductive layer of a first conductivity type.

FIG. 2 shows relations between carrier densities and Zener voltage of SiC Zener diodes manufactured as described above wherein the p-n junction is a step junction and the acceptor density≧the donor density. The voltage values indicated in the figure are Zener voltages. The figure shows that diodes having a wide range of Zener voltages may be obtained by appropriately selecting the donor density and the acceptor density. It will be understood that the carrier densities should be high in order to obtain diodes having a low Zener voltage.

The upper limits of the carrier densities are restricted by, for example, solid solubility limit of dopants (also referred to as impurities) in SiC. For example, Non-Patent Documents 3 and 4 report that aluminum which is a dopant in a p-type conductive layer has a solid solubility limit in SiC of approximately $2 \times 10^{21}$ cm$^{-3}$, and that the upper limit of solid solubility for aluminum to be able to function as acceptor in SiC is approximately $8.9 \times 10^{19}$ cm$^{-3}$. Similarly, the upper limit of solid solubility is approximately $4 \times 10^{19}$ cm$^{-3}$ for nitrogen which is a dopant in an n-type conductive layer to be able to function as donor in SiC (Non-Patent Documents 6 and 7). It is reported that stacking fault becomes marked in a nitrogen-doped n-type conductive layer when the donor density is $2 \times 10^{19}$ cm$^{-3}$ or more (Non-Patent Document 5).

SiC Zener diodes manufactured by the conventional methods have problems as described below.

First, epitaxial growth of an SiC conductive layer of a second conductivity type encounters the following problem. In the process of epitaxially growing an SiC conductive layer, the doping density is unstable during the transition period from immediately after the epitaxial growth is initiated (the gas introduction is started) until a steady state is reached.

An exemplary diode production case will be considered wherein an n-type conductive layer is formed on an n-type substrate and a p-type conductive layer is epitaxially grown thereon and wherein the n-type conductive layer has a donor density of $1 \times 10^{18}$ cm$^{-3}$ and the target Zener voltage of the diode is 70 V. In this case, the p-type epitaxial layer should have an acceptor density of $1 \times 10^{19}$ cm$^{-3}$. However, as shown in FIG. 3, an acceptor density in the vicinity of the p-n junction that deviates from the designed value changes the obtainable Zener voltage ranging from 60 V to 130 V. As a result, the Zener voltage cannot be obtained as designed and yields are deteriorated. In particular, it is illustrated that a Zener voltage that greatly deviates from the designed value will result when the acceptor density is lower than designed.

The allowable transition period is generally estimated from the width of the depletion layer extending in the p-type conductive layer and the epitaxial growth rate. FIG. 4 shows relations between the Zener voltage and the width of a depletion layer extending in a p-type conductive layer (namely, the thickness of a depletion layer formed in a p-type conductive layer).

From FIG. 4, diodes with a Zener voltage of 10 V to 100 V have a depletion layer extending in a thickness of several nm to about 100 nm in the p-type conductive layer. That is, the acceptor density in the p-type conductive layer should be stabilized at least while the p-type conductive layer is grown from the p-n interface to a thickness of several hundreds of pm to 10 nm (approximately 1/10 of the thickness of the depletion layer). If the assumption is made that the epitaxial growth rate is 2 to 20 μm/h, the acceptor density has to be stabilized within several seconds after the initiation of the epitaxial growth. However, current epitaxial growing technology is incapable of such control.

Non-Patent Document 2 reports mesa SiC Zener diodes having a Zener voltage of about 22 V. The diodes are described to have an acceptor density of $1 \times 10^{19}$ cm$^{-3}$. From FIG. 2, however, the Zener voltage obtainable with that acceptor density will be likely in the range of 40 to 50 V. This Zener voltage of approximately 22 V is considered to have caused by conduction due to an electric field locally concentrated at mesa ends or by a higher-than-expected acceptor density in the p-type conductive layer in the vicinity of the p-n junction interface.

As described above, obtaining a Zener voltage as designed and with reproducibility is difficult when a p-n junction is formed by epitaxial growth.

Ion implantation is an alternative to epitaxial growth to produce p-type conductive layers. The ion implantation permits relatively precise control of the doping density compared to the epitaxial growing. The Zener voltage of diodes having a p-type conductive layer by ion implantation is dependent on the donor density in the n-type conductive layer and ion implanting conditions (e.g., ion species, dose, implanting energy).

FIG. 5 shows relations among ion implanting energy, Zener voltage and implantation depth in the production of p-type conductive layers wherein the p-type conductive layers are formed on respective n-type conductive layers having a donor density (Nd) of $1\times10^{17}$ cm$^{-3}$, $1\times10^{18}$ cm$^{-3}$, $2\times10^{18}$ cm$^{-3}$, $2\times10^{19}$ cm$^{-3}$ or $4\times10^{19}$ cm$^{-3}$ with use of aluminum as dopant such that the doping density of the p-type conductive layer from the ion implantation surface to the ion implantation depth will be $2\times10^{21}$. The Zener voltage is shown to increase with increasing implanting energy or increasing implantation depth in the range of implanting energy from 10 to 500 keV. The figure also shows a trend that the relations between the Zener voltage and the other two reach saturation at implanting energy of above 500 keV.

In practical diodes, an anode electrode is formed on the surface of a p-type conductive layer. A thin metal layer as an electrode material is formed on the surface of a p-type conductive layer, and the electrode material metal and SiC are annealed at high temperatures to form an alloy layer, resulting in an ohmic electrode. The distance between the alloy layer and the p-n junction interface, namely the thickness of the p-type conductive layer should be large enough to prevent punching through. For example, the thickness of the p-type conductive layer is 1 μm or more. When a p-type conductive layer is formed by ion implantation as described above, it is difficult as shown in FIG. 5 that the diode has a Zener voltage of 30 to 40 V or below even if conductive layers with high carrier densities are adopted.

To form a p-type conductive layer in a thickness of 1 μm or more by ion implantation, implanting energy of 1 MeV or more is required. Provided that the maximum implanting energy is 1 MeV and a box profile is formed which has an Al doping density of $2\times10^{21}$ cm$^{-3}$ corresponding to the solid solubility limit of Al, the dose of Al ions is approximately $2\times10^{17}$ cm$^{-2}$. Ion implantation involving such high dose energy and high dose increases costs, and therefore it is not preferable that p-type conductive layers are formed by ion implantation alone.

The present invention has been made in order to solve the problems in the background art as described above. It is therefore an object of the invention to provide bipolar semiconductor devices that have a Zener voltage controlled highly precisely in a wide range of Zener voltages (for example, from 10 to 500 V). It is another object of the invention to manufacture diodes having a wide range of Zener voltages (for example, from 10 to 500 V) with high yields.

Attempts to produce Zener diodes having a wide range of Zener voltages (for example, from 10 to 500 V) with high yields by conventional methods have encountered the problems summarized as follows.

When Layer of a Second Conductivity Type is Formed by Epitaxial Growing:

The carrier densities should be stabilized within several seconds after the initiation of the epitaxial growth. However, the current epitaxial growing technology is incapable of such control.

When Layer of a Second Conductivity Type is Formed by Ion Implantation Alone

The layer of second conductivity type should be formed in a thickness of 1 μm or more, namely, with implanting energy of 1 MeV or more, to prevent punching through. Such ion implantation process is not preferable because it involves high energy and high dose and increases costs. Further, this technique cannot produce Zener diodes having a Zener voltage of 40 V or below.

SUMMARY OF THE INVENTION

The present inventors diligently studied to solve the foregoing problems. They have then invented a diode-manufacturing method in which a conductive layer of a second conductivity type is formed with a controlled doping density by ion implantation or the like on the surface of a conductive layer of a first conductivity type, and a conductive layer of a second conductivity type is further formed thereon by epitaxial growth or the like, whereby the carrier densities in the vicinity of the p-n junction interface are controlled and the conductive layer of a second conductivity type has a sufficient thickness. It has also been found that the diodes (Zener diodes) thus manufactured have a wide range of Zener voltages with high precision. The present invention has been completed based on these findings.

A bipolar semiconductor device according to the present invention has a mesa structure and comprises a silicon carbide single crystal substrate of a first conductivity type, a silicon carbide conductive layer of a first conductivity type, a highly doped layer of a second conductivity type and a silicon carbide conductive layer of a second conductivity type which substrate and conductive layers are laminated in the order named.

Preferably, the silicon carbide conductive layer of a first conductivity type and the silicon carbide conductive layer of a second conductivity type are formed by epitaxial growth.

Preferably, the highly doped layer is formed by ion implantation.

When the second conductivity type is p type, the highly doped layer is preferably formed by ion implantation of aluminum.

When the second conductivity type is n type, the highly doped layer is preferably formed by ion implantation of nitrogen or phosphorus.

Preferably, the highly doped layer has a thickness in the range of 15 nm to 550 nm and a doping density in the range of $1\times10^{17}$ cm$^{-3}$ to $2\times10^{21}$ cm$^{-3}$.

A first method of controlling the Zener voltage according to the present invention is a method for controlling the Zener voltage of the bipolar semiconductor devices described above and comprises controlling the doping density of the highly doped layer to from $1\times10^{17}$ cm$^{-3}$ to $2\times10^{21}$ cm$^{-3}$ whereby Zener voltages of 10 to 500 V are variably obtained.

A second method of controlling the Zener voltage according to the present invention is a method for controlling the Zener voltage of the bipolar semiconductor devices described above and comprises controlling the doping density of the silicon carbide conductive layer of a first conductivity type to from $5 \times 10^{16}$ cm$^{-3}$ to $4 \times 10^{19}$ cm$^{-3}$ whereby Zener voltages of 10 to 500 V are variably obtained.

A method for producing the bipolar semiconductor devices according to the present invention comprises forming the silicon carbide conductive layer of a first conductivity type on the silicon carbide single crystal substrate of a first conductivity type by epitaxial growth, forming the highly doped layer of a second conductivity type on the surface of the silicon carbide conductive layer of a first conductivity type by ion implantation under conditions such that the implanting energy is 10 keV to 500 keV and the dose is in the range of $1.5 \times 10^{13}$ to $1 \times 10^{17}$ cm$^{-2}$, and forming the silicon carbide conductive layer of a second conductivity type on the surface of the highly doped layer of a second conductivity type by epitaxial growth.

In the method, it is preferable that the highly doped layer is formed by ion implantation and is thereafter heat treated at a temperature of 1600° C. or above to activate ions that have been implanted, and the silicon carbide conductive layer of a second conductivity type is formed on the highly doped layer by epitaxial growth.

The bipolar semiconductor devices of the invention have a Zener voltage controlled highly precisely in a wide range of Zener voltages (for example, from 10 to 500 V).

According to the present invention, diodes are manufactured in which the carrier densities in the vicinity of the p-n junction interface are controlled and the conductive layer of a second conductivity type has a sufficient thickness. The present invention thus allows for the production of diodes having a wide range of Zener voltages (for example, from 10 to 500 V) with high yields.

PREFERRED EMBODIMENTS FOR CARRYING OUT THE INVENTION

The present invention will be described in detail hereinbelow with reference to the drawings.

Figure 1:
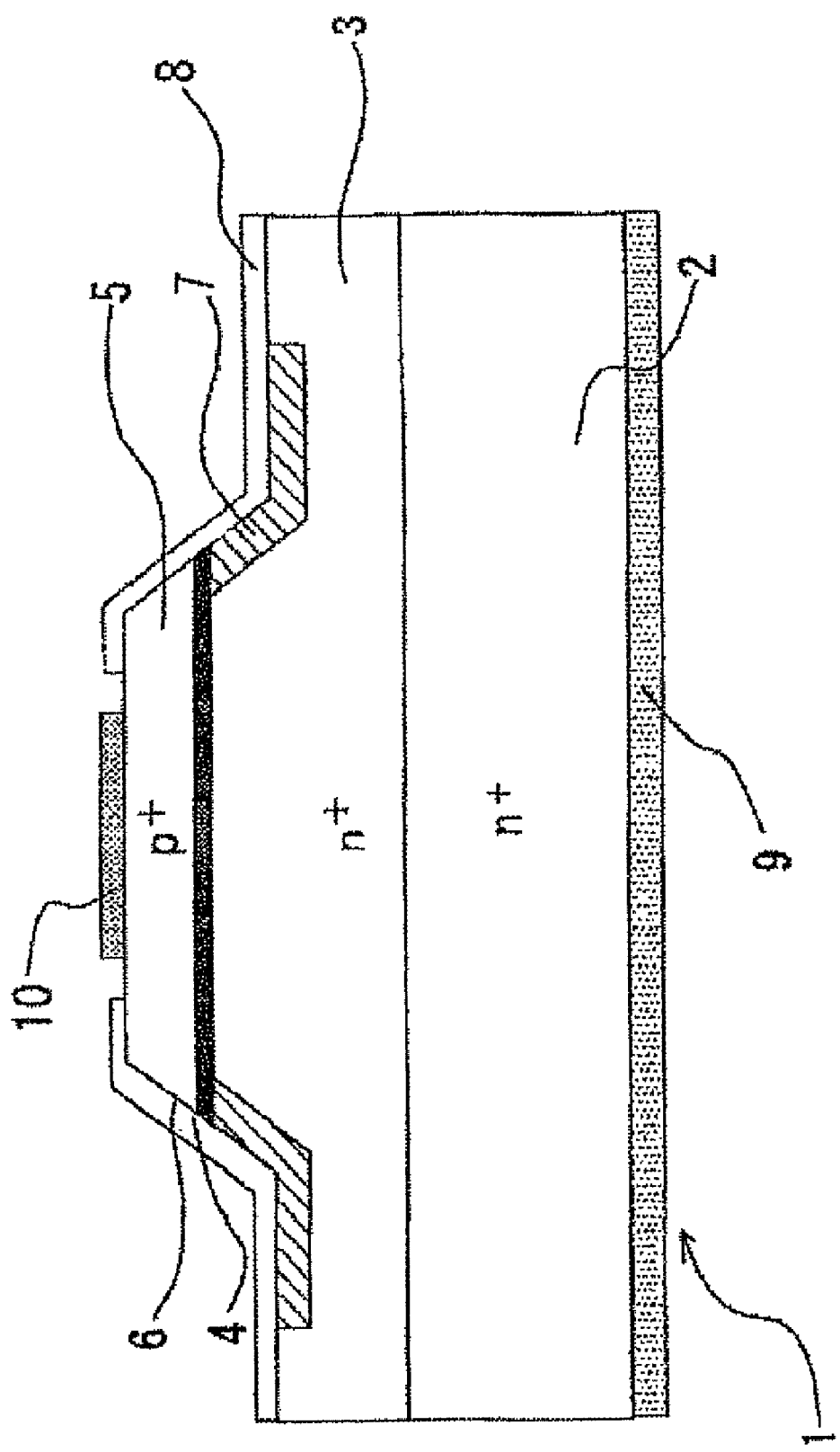
FIG. 1 is a cross sectional view of a bipolar semiconductor device (a silicon carbide (SiC) Zener diode) according to an embodiment of the present invention.

FIG. 1 shows a bipolar semiconductor device (a silicon carbide (SiC) Zener diode) 1 according to the present invention wherein a silicon carbide single crystal substrate 2 of a first conductivity type, a silicon carbide conductive layer 3 of a first conductivity type, a highly doped layer 4 of a second conductivity type and a silicon carbide conductive layer 5 of a second conductivity type are laminated in this order. This figure is only explanatory, and the actual size or the like will be understood by the skilled person based on the description of the specification and common knowledge in the art. In the invention, the word "on" may indicate a positional relation along the direction extending from the silicon carbide single crystal substrate 2 of a first conductivity type toward the silicon carbide conductive layer 3 of a first conductivity type.

The present invention will be described below focusing on a semiconductor device in which the first conductivity type is an n-type and the second conductivity type is a p-type.

The silicon carbide single crystal substrate 2 of first conductivity type (n$^+$ substrate) is an n-type SiC single crystal substrate that is obtained by, for example, slicing an SiC bulk crystal formed by a sublimation method (a modified Lely method), a CVD method or the like.

The silicon carbide conductive layer 3 of a first conductivity type (n$^+$ conductive layer) has nitrogen or phosphorus as a dopant. The donor density is approximately $5 \times 10^{16}$ cm$^{-3}$ to $4 \times 10^{19}$ cm$^{-3}$. From the viewpoint of preventing stacking fault, the donor density is preferably not more than $2 \times 10^{19}$ cm$^{-3}$. By appropriately selecting the donor density in the above range, Zener voltages of 10 to 500 V can be variably obtained.

The n$^+$ conductive layer 3 may be formed by methods such as epitaxial growth. An n$^+$ SiC single crystal layer that is of the same crystal type as the n$^+$ substrate 2 is epitaxially grown to form an n$^+$ conductive layer 3.

The bipolar semiconductor devices of the invention have the highly doped layer 4 of a second conductivity type (the p$^+$ highly doped layer) between the silicon carbide conductive layer 3 of a first conductivity type (the n$^+$ conductive layer) and the silicon carbide conductive layer 5 of a second conductivity type (the p$^+$ conductive layer). Preferably, the highly doped layer 4 of a second conductivity type (the p$^+$ highly doped layer) has a doping density that is higher than that of the p$^+$ conductive layer 5.

The p$^+$ highly doped layer 4 allows for increasing the precision of Zener voltage even if the doping density of the p$^+$ conductive layer 5 is unstable.

The thickness of the p$^+$ highly doped layer 4 is preferably in the range of 15 to 550 nm, more preferably 30 to 550 nm, and still more preferably 50 to 550 nm.

When the highly doped layer 4 of a second conductivity type p$^+$ highly doped layer) is formed by ion-implantation into the surface of the silicon carbide conductive layer 3 of a first conductivity type (n$^+$ conductive layer), the "thickness of the highly doped layer 4 of a second conductivity type p$^+$ highly doped layer)" is a distance (depth) from the surface to a position that gives the highest acceptor density in a relationship between the depth direction and the doping density distribution (in the case of multistage ion implantation, the doping density distribution obtained by the largest ion implanting energy).

Figure 4:
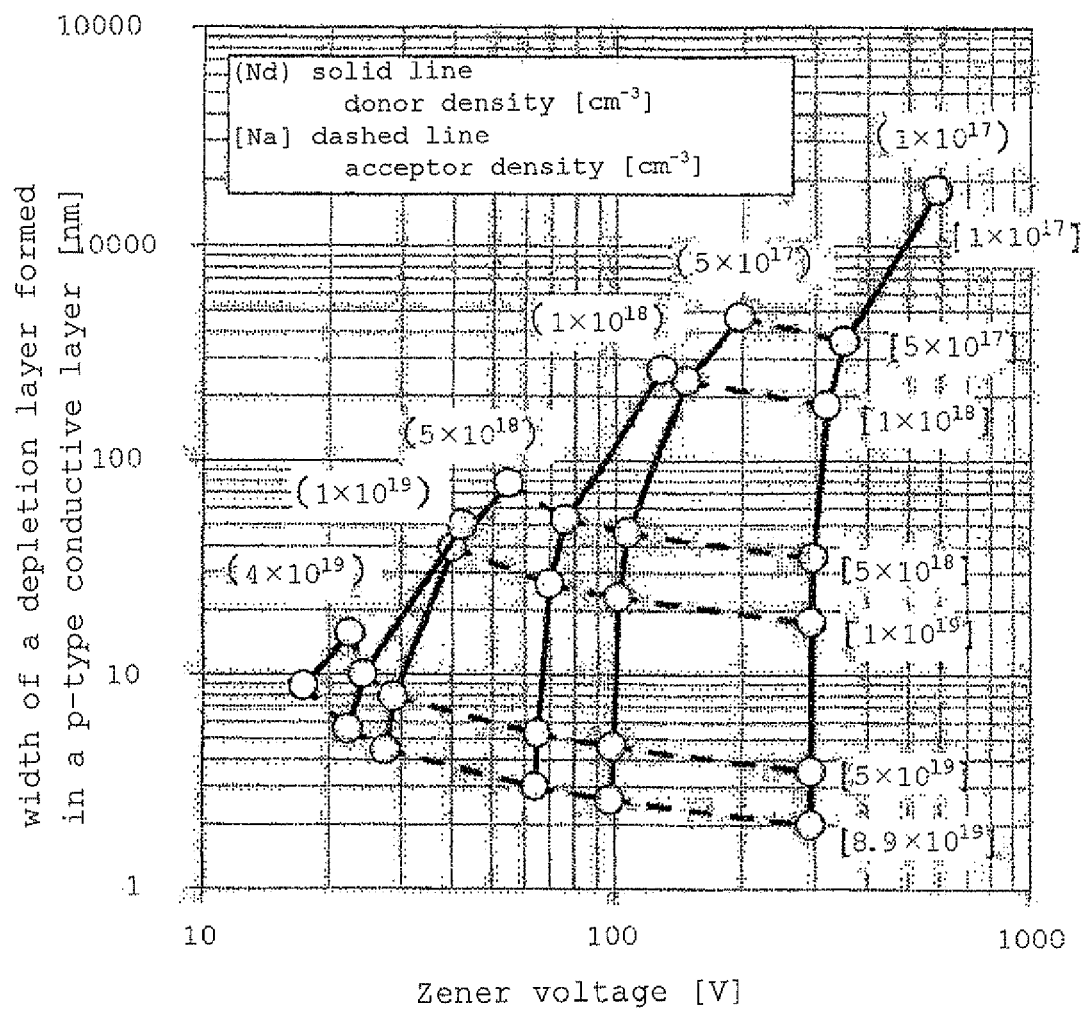
FIG. 4 is a graph showing relations between the Zener voltage and the thickness of a depletion layer formed in a p-type conductive layer.

To achieve a Zener voltage of 10 to 500 V, the acceptor density of the p-type highly doped layer 4 will be appropriately in the range of $1 \times 10^{17}$ cm$^{-3}$ to $8.9 \times 10^{19}$ cm$^{-3}$. From FIG. 4, the acceptor density is desirably $2 \times 10^{18}$ cm$^{-3}$ or more in order to obtain a low Zener voltage, particularly about 10 to 100 V.

Herein, the Al doping density by the ion implantation and the acceptor density have different meanings as described below. Al ions that have been implanted are activated by activation treatment (high temperature annealing) after the ion implantation and function as acceptors. When an acceptor density of $8.9 \times 10^{19}$ cm$^{-3}$ is desired and the Al activation rate after the activation treatment is 10%, Al ions should be implanted to a doping density of $8.9 \times 10^{20}$ cm$^{-3}$. Because the activation rate varies depending on activation treatment conditions, the solid solubility limit of aluminum to SiC, $2\times10^{21}$ cm$^{-3}$, is defined as the upper limit of the Al doping density. The upper limit for Al to function as an acceptor is allegedly $8.9\times10^{19}$ cm$^{-3}$.

The p-type highly doped layer 4 may be formed by methods such as ion implantation into the surface of the n$^+$ conductive layer 3 (ion implantation method) and thermal diffusion. Unlike Si, SiC has a low diffusion constant for dopant atoms. In view of this, it is difficult to adopt thermal diffusion for SiC, and thus ion implantation is preferred.

The ions to be implanted preferably involve boron or aluminum ions. In particular, aluminum is preferable because aluminum is less liable to diffuse in silicon carbide at high temperatures compared to boron, that is, a doping profile is obtained substantially as designed without altering the profile that is implanted.

In the p-type highly doped layer 4 by the ion implantation (the p-type ion implanted layer), the maximum doping density of the part from the implantation surface to a depth of from 15 nm to 550 nm is preferably $1\times10^{17}$ cm$^{-3}$ to $2\times10^{21}$ cm$^{-3}$, and more preferably $2\times10^{18}$ cm$^{-3}$ to $2\times10^{21}$ cm$^{-3}$.

To obtain a Zener voltage of 10 to 500 V, it will be recommended that the p-type highly doped layer 4 is formed by ion implantation under conditions such that the implanting energy is 1 eV to 10 MeV and the dose will be $1.5\times10^{13}$ to $1\times10^{17}$ cm$^{-2}$. A box profile may be created by multistage energy ion implantation.

Figure 5:
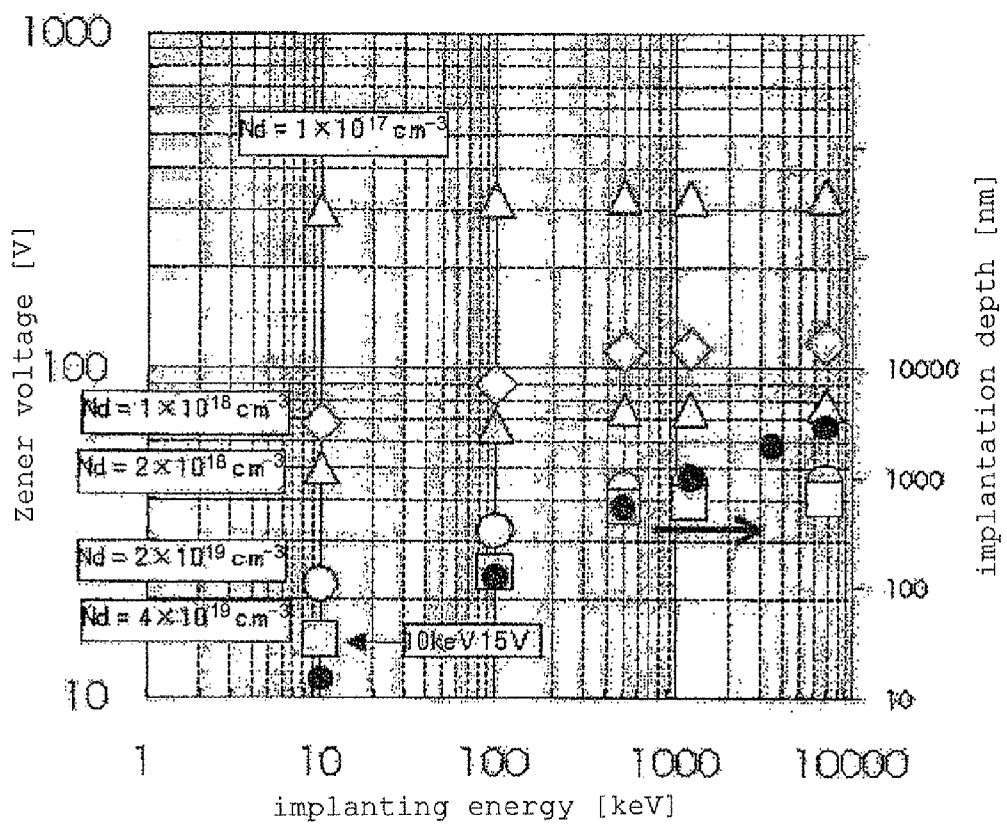
FIG. 5 is a graph showing relations between ion implanting conditions and Zener voltage.
Figure 6:
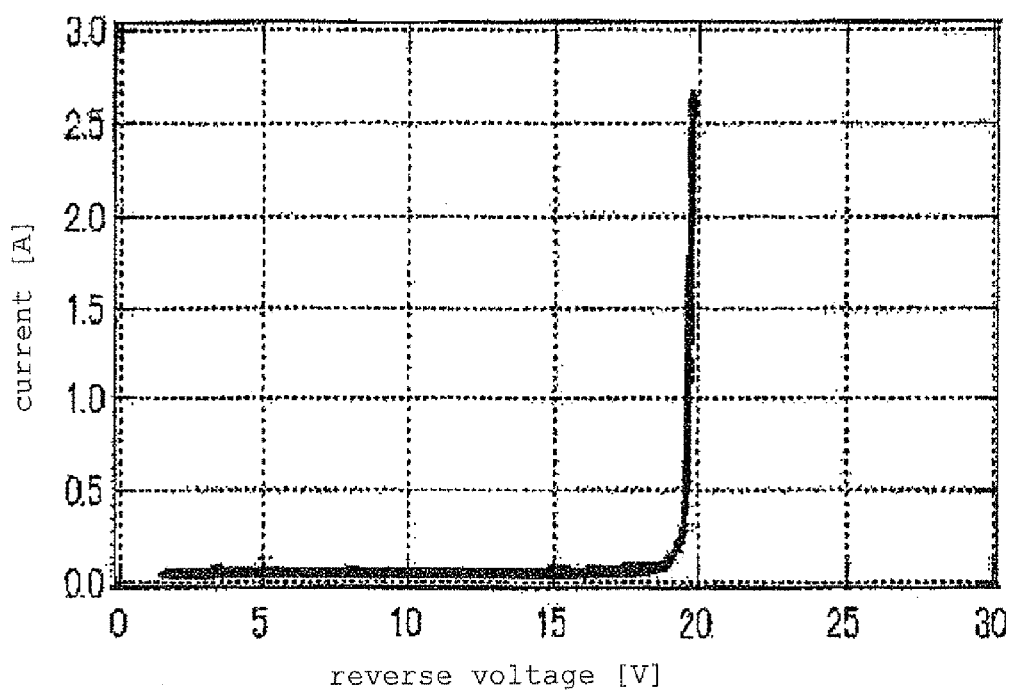
FIG. 6 is a graph showing current-reverse voltage properties of an SiC Zener diode.

In particular, to obtain a low Zener voltage of about 10 to 100 V, it is preferable that the ion implantation is performed under conditions such that the implanting energy is 10 to 500 keV and the dose will be $3\times10^{14}$ to $1\times10^{17}$ cm$^{-2}$. The lower limit of the implanting energy is the lowest energy that permits ion implanting. The upper limit of the implanting energy may be derived from FIG. 5. FIG. 5 shows relations between the implanting energy and the Zener voltage when the acceptor density in a p-type ion implanted layer is fixed at $8.9\times10^{19}$ cm$^{-3}$. As seen in FIG. 5, the Zener voltage does not change when the implanting energy is increased above 500 keV. Based on this, the upper limit of the implanting energy is determined to be 500 keV.

From FIG. 5, the Zener voltage can be easily controlled with high precision by changing the implanting energy within the range of from 10 to 500 keV.

The lower limit of the dose is determined as a dose that is required to obtain a doping density of $1\times10^{17}$ cm$^{-3}$ at implanting energy of 10 keV. The upper limit of the dose is determined as a total dose that is required to obtain a box profile with a doping density of $2\times10^{21}$ cm$^{-3}$ by multistage implantation at 10 to 500 keV.

After the ion implantation and before the formation of the p$^+$ conductive layer 5, the implanted ions are preferably activated by heat treatment at temperatures of 1600° C. to 1800° C. in an atmosphere such as Ar. The heat treatment time may be about 1 to 30 minutes.

The silicon carbide conductive layer 5 of a second conductivity type (the p$^+$ conductive layer) contains boron or aluminum as a dopant, and the acceptor density is preferably in the range of $5\times10^{17}$ cm$^{-3}$ to $8.9\times10^{19}$ cm$^{-3}$, and more preferably $5\times10^{18}$ cm$^{-3}$ to $8.9\times10^{19}$ cm$^{-3}$. The p$^+$ conductive layer 5 ensures that the p-n junction interface is sufficiently separated from an anode electrode described later and that problems such as punching through are prevented, increasing the yields in the manufacturing of the bipolar semiconductor devices.

The p$^+$ conductive layer 5 may be produced by methods such as epitaxial growth. After the p$^+$ ion implanted layer 4 is formed, a p$^+$ SiC single crystal layer is epitaxially grown on the p$^+$ ion implanted layer 4 to form a p$^+$ conductive layer 5.

The bipolar semiconductor device 1 according to the present invention has a mesa structure. The mesa structure may be prepared by the following procedures.

First, a silicon-oxide layer is formed in a thickness of about 10 µm by, for example, a CVD (chemical vapor deposition) method on the silicon carbide conductive layer 5 of a second conductivity type (the p$^+$ conductive layer). On the silicon-oxide layer, a photoresist layer corresponding to the mesa shape is formed by photolithography technique. Subsequently, the silicon-oxide layer exposed from the photoresist layer is removed with hydrofluoric acid, whereby the silicon-oxide layer on the p$^+$ conductive layer 5 corresponds to the mesa shape.

With this silicon-oxide layer as a mask, the exposed area of the silicon carbide conductive layer 5 of a second conductivity type (the p$^+$ conductive layer) is processed by, for example, reactive ion etching (RIE) to remove regions extending from the silicon carbide conductive layer 5 of a second conductivity type (the p$^+$ conductive layer) to a depth in the silicon carbide conductive layer 3 of a first conductivity type (the n$^+$ conductive layer), thereby forming a mesa structure 6. The height and width of the mesa structure may be, for example, each 4 µm. The RIE mask is not limited to a silicon-oxide layer and may be aluminum, nickel or the like.

To relax the concentration of electric field around the mesa structure, the bipolar semiconductor device 1 preferably has an electric field relaxing structure 7 which extends at least from the p-n junction interface to the periphery of the mesa structure. The electric field relaxing structure 7 in the bipolar semiconductor device 1 prevents local concentration of electric field possibly caused at the p-n interface ends or due to the mesa shape, and spreads the electric field concentration to the entire p-n interface, whereby local dielectric breakdown in the semiconductor device is avoided. The electric field relaxing structure 7 may be provided by implanting boron or aluminum ions as dopants at least from the p-n junction interface to the mesa periphery. The ions implanted are thereafter activated by heat treatment at temperatures of 1600° C. to 1800° C. in an atmosphere such as Ar.

In a preferred embodiment, the bipolar semiconductor device 1 has an oxidized layer 8 with a thickness of about 40 nm to protect the surface of the device. The oxidized layer 8 may be formed by, for example, thermal oxidation.

A cathode electrode 9 and an anode electrode 10 for the bipolar semiconductor device 1 may be prepared by, for example the following method. First, unnecessary portions of the oxidized layers 8 are removed from the silicon carbide single crystal substrate 2 of a first conductivity type (the n$^+$ substrate) and the silicon carbide conductive layer 5 of a second conductivity type (the p$^+$ conductive layer) by photolithography technique and with use of hydrofluoric acid, thereby exposing the silicon carbide conductive layers. Thereafter, nickel as a cathode electrode 9 is deposited (for example, to a thickness of 350 nm) on the lower surface of the n$^+$ substrate 2 by a sputtering method or the like, and titanium and aluminum as an anode electrode 10 are deposited (for example, to a thickness of 50 nm and a thickness of 125 nm, respectively) on the upper surface of the p$^+$ conductive layer 5 by a sputtering method or the like. These electrodes are alloyed to form ohmic electrodes by heat treatment of these thin metal layers.

In the invention, the crystal types or crystal planes of the SiC single crystals are not particularly limited, and the advantageous effects of the invention are achieved with various kinds of crystals.

In the bipolar semiconductor devices 1 described hereinabove, the first conductivity type is an n-type and the second conductivity type is a p-type (the n+ substrate 2, the n+ conductive layer 3, the p+ highly doped layer 4 and the p+ conductive layer 5 are laminated in this order). The conductivity types may be reversed, that is, the first conductivity type may be a p-type and the second conductivity type may be an n-type (the p+ substrate 2, the p+ conductive layer 3, the n+ highly doped layer (the n+ ion implanted layer) 4 and the n+ conductive layer 5 are laminated in this order).

EXAMPLES

The present invention will be described in greater detail hereinbelow without limiting the scope of the invention.

Examples

A plurality of SiC Zener diodes (hereinafter, also "devices") as shown in FIG. 1 were manufactured by the following procedures.

An n+ substrate 2 (donor density: $7 \times 10^{18}$ cm$^{-3}$, thickness: 400 μm) was provided which was an n-type 4H—SiC single crystal substrate obtained by slicing an SiC bulk crystal produced by a sublimation method (a modified Lely method). On the substrate, an n+ SiC single crystal layer that was of the same crystal type as the n+ substrate 2 was epitaxially grown to form an n+ conductive layer 3. The n+ conductive layer 3 contained nitrogen as a dopant, and the donor density in the n+ conductive layer 3 was $2 \times 10^{19}$ cm$^{-3}$.

Subsequently, aluminum ions were implanted into the surface of each n+ conductive layer 3 to form a p-type ion implanted layer 4. The ion implantation conditions were such that the implanting energy was 30 keV and the dose would be $4 \times 10^{15}$ cm$^{-2}$. The profile of doping density in the depth direction under these conditions was such that the maximum doping density was $1 \times 10^{21}$ cm$^{-3}$ at a depth of 30 nm from the implantation surface. Namely, the layer 4 was a p+ highly doped layer which had a thickness of 30 nm and a maximum doping density of $1 \times 10^{21}$ cm$^{-3}$.

After the ion implantation and before the formation of a p+ conductive layer 5 as described below, the ions that had been implanted (the implanted ions) were activated by heat treatment at 1800° C. for 3 minutes in an Ar atmosphere.

After the p+ ion implanted layer 4 was prepared, a p+ SiC single crystal layer was epitaxially grown on the p+ ion implanted layer 4 to form a p+ conductive layer 5. The p+ conductive layer 5 contained aluminum as a dopant, and the acceptor density in the p+ conductive layer 5 was in the range of $8 \times 10^{18}$ cm$^{-3}$ to $8 \times 10^{19}$ cm$^{-3}$.

Subsequently, a silicon-oxide layer was formed in a thickness of about 10 μm by a CVD method on the p+ conductive layer 5. On the silicon-oxide layer, a photoresist layer corresponding to a mesa shape was formed by photolithography technique. Subsequently, the silicon-oxide layer exposed from the photoresist layer was removed with hydrofluoric acid. With this silicon-oxide layer as a mask, the exposed area of the p+ conductive layer 5 was processed by reactive ion etching (RIE) to remove regions extending from the exposed p+ conductive layer 5 to a depth in the n+ conductive layer 3. Thus, a mesa structure 6 having a height and a width of 4 μm each was formed.

To relax the concentration of electric field around the mesa structure, aluminum ions as dopants were implanted to form an electric field relaxing structure 7. The ions implanted were thereafter activated by heat treatment at temperatures of 1600° C. to 1800° C. in an Ar atmosphere.

To protect the surfaces of the device, oxidized layers 8 were formed in a thickness of about 40 nm by thermal oxidation on the surfaces of the device other than electrodes.

Subsequently, unnecessary portions of the silicon-oxide layer and oxidized layers 8 were removed from the n+ substrate 2 and the p+ conductive layer 5 by photolithography technique and with use of hydrofluoric acid, thereby exposing the silicon carbide conductive layers. Thereafter, nickel as a cathode electrode 9 was sputtered to form a thin metal layer (thickness: 350 nm) on the lower surface of the n+ substrate 2 and was alloyed by heat treatment at 1100° C. to form an ohmic electrode. Similarly, titanium and aluminum as an anode electrode 10 were sputtered successively to form thin metal layers (thicknesses: 50 nm and 125 nm, respectively) on the upper surface of the p+ conductive layer 5 and were alloyed by heat treatment at 900° C. to form an ohmic electrode.

Comparative Example

A plurality of devices were manufactured in the same manner as in Example except that the p+ ion implanted layer 4 was not formed. The donor density of the n+ conductive layer 3 was $1 \times 10^{19}$ cm$^{-3}$, and the acceptor density of the p+ conductive layer 5 was in the range of $1 \times 10^{18}$ cm$^{-3}$ to $5 \times 10^{18}$ cm$^{-3}$.

[Results]

Figure 2:
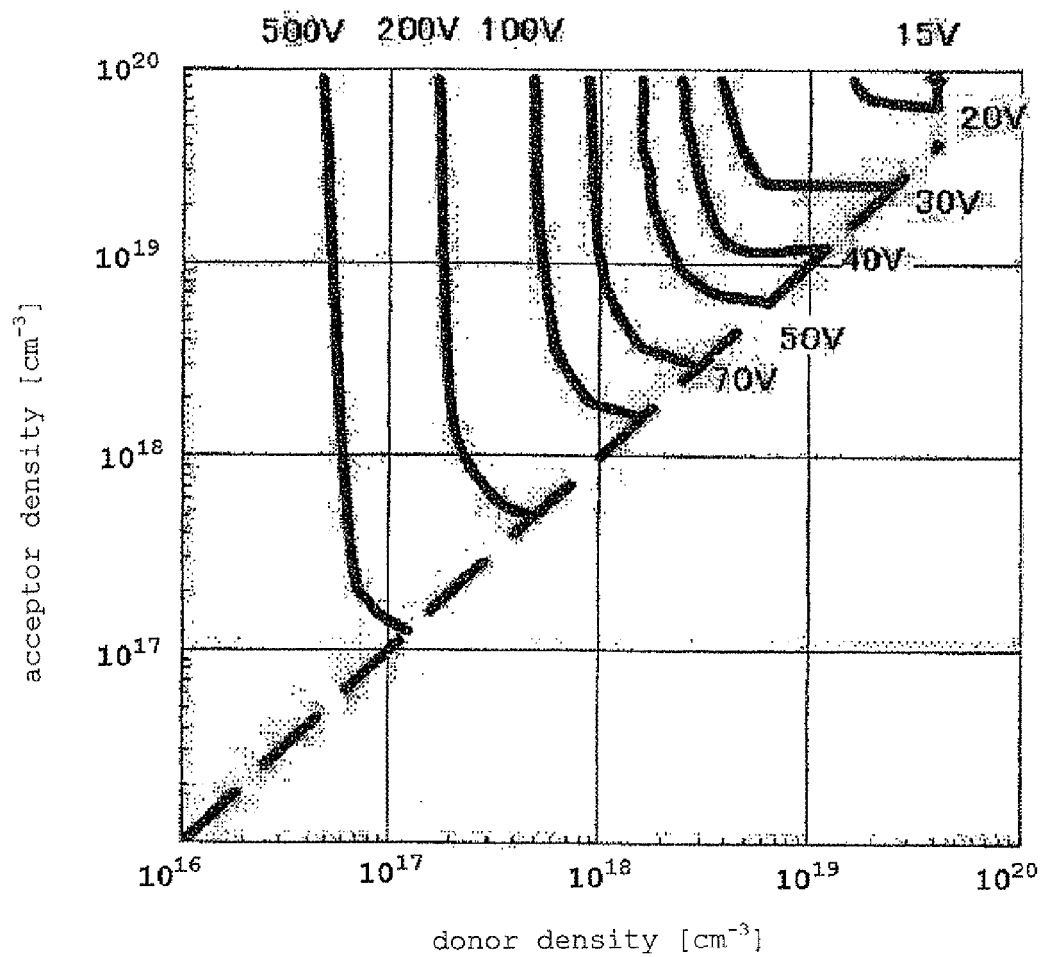
FIG. 2 is a graph showing relations between the carrier densities (the donor density and the acceptor density) in the vicinity of a p-n junction interface and the Zener voltage.
Figure 3:
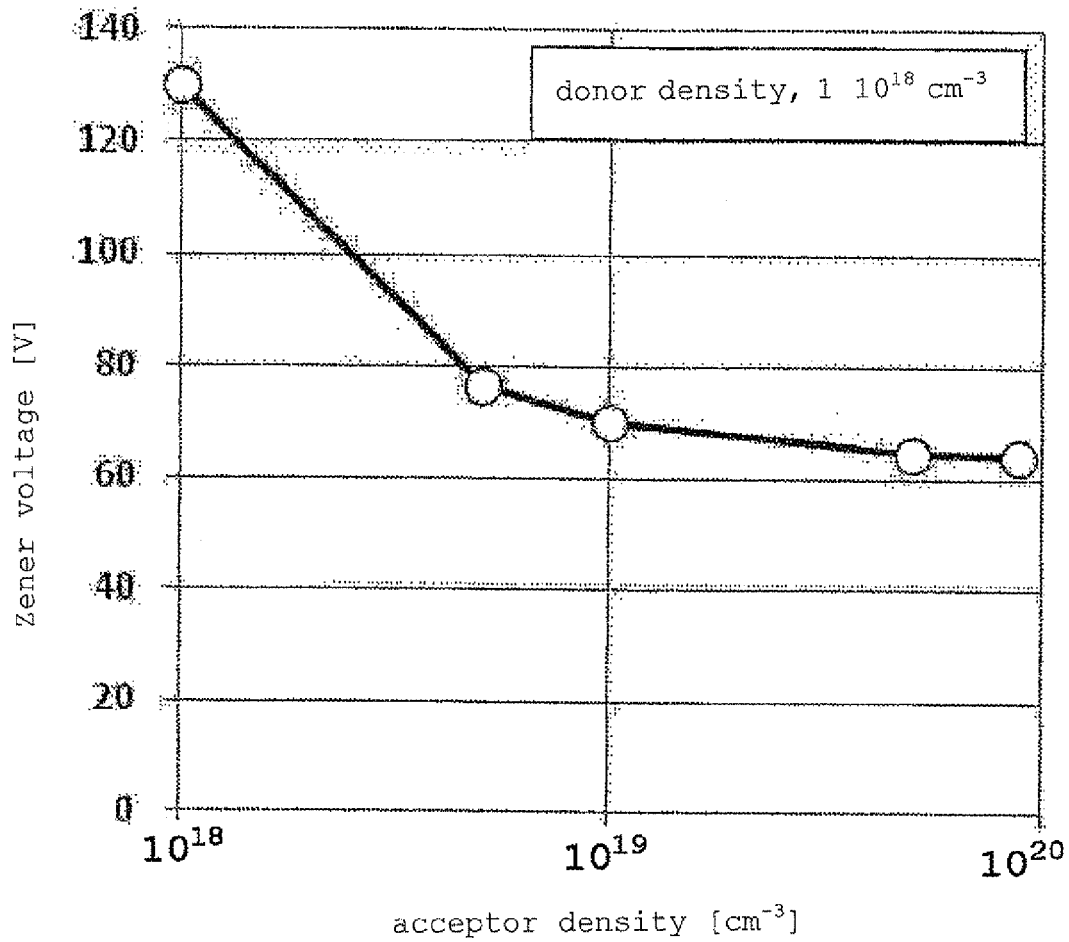
FIG. 3 is a graph showing relations between the acceptor density and the Zener voltage.

From FIG. 2, a donor density of $2 \times 10^{19}$ cm$^{-3}$ with control of the acceptor density will provide a Zener voltage of about 15 to 30 V.

Similarly, a donor density of $1 \times 10^{19}$ cm$^{-3}$ in Comparative Example with control of the acceptor density will provide a Zener voltage of about 20 to 40 V.

Figure 7:
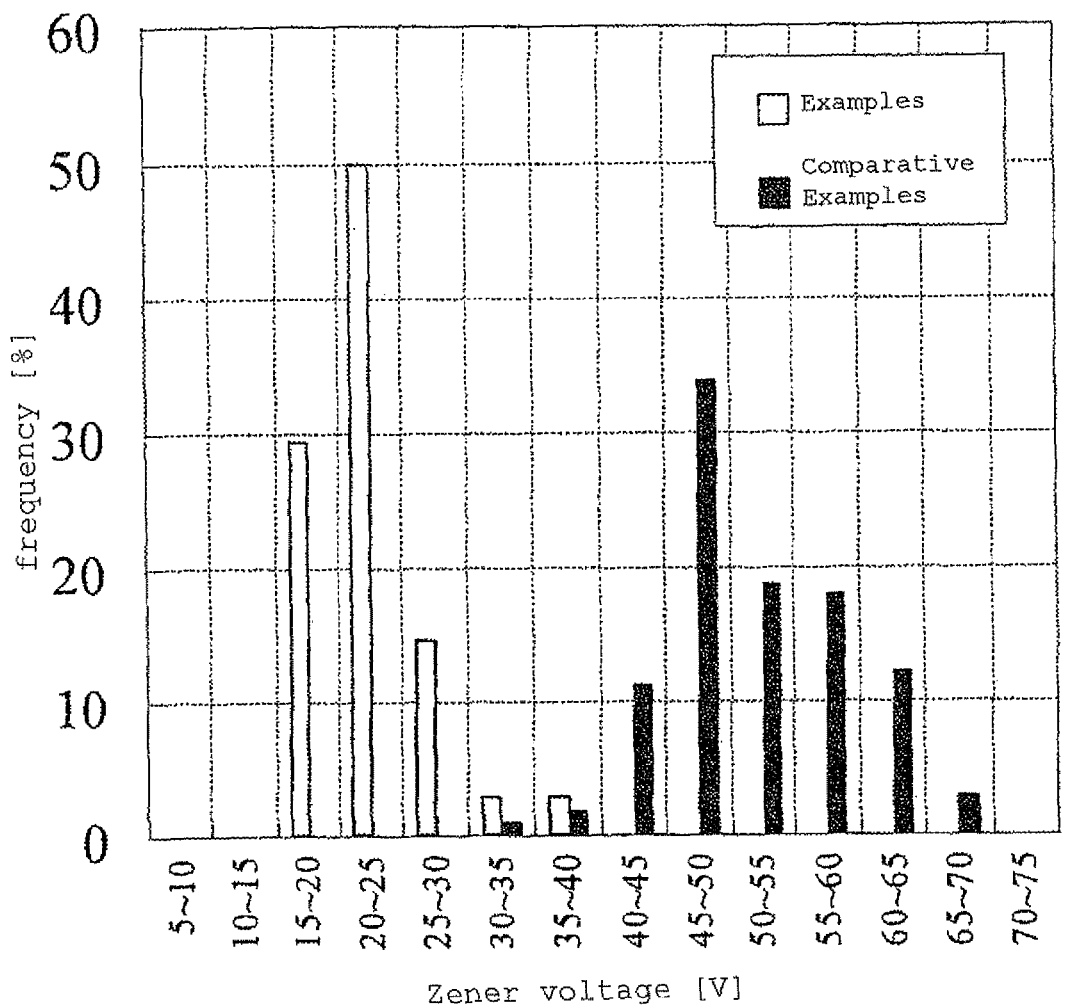
FIG. 7 is a graph showing Zener voltages of bipolar semiconductor devices manufactured in Examples and Comparative Examples.

The results of evaluation of the Zener voltage are given in FIG. 7. Sixty five percent (65%) of the devices in Example had a Zener voltage in the range of 20±2 V (as an example, current-reverse voltage properties are shown in FIG. 5). In contrast, the Zener voltages obtained in Comparative Example were higher than expected, being 40 or more, and were widely ranging from 40 to 75 V. This result was due to a lower acceptor density in the p-type conductive layers in Comparative Example.

The above results show that the provision of the p+ ion implanted layer 4 between the n+ conductive layer 3 and the p+ conductive layer 5 reduces the variations in Zener voltage values (increases the yields) and allows for diodes having a low Zener voltage that is not feasible when a p+ conductive layer is formed by ion implantation alone.

The invention claimed is:

1. A bipolar semiconductor device which has a mesa structure and comprises a silicon carbide single crystal substrate of a first conductivity type, a silicon carbide conductive layer of a first conductivity type, a highly doped layer of a second conductivity type and a silicon carbide conductive layer of a second conductivity type which substrate and conductive layers are laminated in the order named, wherein a portion of the highly doped layer positioned between the silicon carbide conductive layer of the first conductivity type and the silicon carbide conductive layer of the second conductivity type has a thickness in the range of 15 nm to 550 nm and a doping density in the range of $1 \times 10^{17}$ cm$^{-3}$ to $2 \times 10^{21}$ cm$^{-3}$.

2. The bipolar semiconductor device according to claim 1, wherein the silicon carbide conductive layer of a first conductivity type and the silicon carbide conductive layer of a second conductivity type are formed by epitaxial growth.

3. The bipolar semiconductor device according to claim 2, wherein the highly doped layer is formed by ion implantation.

4. The bipolar semiconductor device according to claim 1, wherein the highly doped layer is formed by ion implantation.

5. The bipolar semiconductor device according to claim 4, wherein the second conductivity type is p type and the highly doped layer is formed by ion implantation of aluminum.

6. The bipolar semiconductor device according to claim 4, wherein the second conductivity type is n type and the highly doped layer is formed by ion implantation of nitrogen or phosphorus.

7. A method of controlling the Zener voltage of the bipolar semiconductor devices described in claim 1, which method comprises controlling the doping density of the highly doped layer to from $1\times10^{17}$ cm$^{-3}$ to $2\times10^{21}$ cm$^{-3}$ whereby Zener voltages of 10 to 500 V are variably obtained.

8. A method of controlling the Zener voltage of the bipolar semiconductor devices described in claim 1, which method comprises controlling the doping density of the silicon carbide conductive layer of first conductivity type to from $5\times10^{16}$ cm$^{-3}$ to $4\times10^{19}$ cm$^{-3}$ whereby Zener voltages of 10 to 500 V are variably obtained.

9. A method for producing the bipolar semiconductor devices described in claim 1, which method comprises forming the silicon carbide conductive layer of a first conductivity type on the silicon carbide single crystal substrate of a first conductivity type by epitaxial growth, forming the highly doped layer of a second conductivity type on the surface of the silicon carbide conductive layer of a first conductivity type by ion implantation under conditions such that the implanting energy is 10 keV to 500 keV and the dose is in the range of $1.5\times10^{13}$ to $1\times10^{17}$ cm$^{-2}$, and forming the silicon carbide conductive layer of a second conductivity type on the surface of the highly doped layer of a second conductivity type by epitaxial growth.

10. The method for producing the bipolar semiconductor devices according to claim 9, wherein the highly doped layer is formed by ion implantation and is thereafter heat treated at a temperature of 1600° C. or above to activate ions that have been implanted, and the silicon carbide conductive layer of second conductivity type is formed on the highly doped layer by epitaxial growth.

* * * * *